(12) United States Patent
Tseng et al.

(10) Patent No.: US 9,449,880 B1
(45) Date of Patent: Sep. 20, 2016

(54) FIN PATTERNING METHODS FOR INCREASED PROCESS MARGIN

(71) Applicant: Taiwan Semiconductor Manufacturing Company, Ltd., Hsin-Chu (TW)

(72) Inventors: Chin-Yuan Tseng, Hsinchu (TW); Chi-Cheng Hung, Miaoli County (TW); Chun-Kuang Chen, Hsinchu County (TW); Chih-Ming Lai, Hsinchu (TW); Huan-Just Lin, Hsinchu (TW); Ru-Gun Liu, Hsinchu County (TW); Tsai-Sheng Gau, Hsinchu (TW); Wei-Liang Lin, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/632,979

(22) Filed: Feb. 26, 2015

(51) Int. Cl.
*H01L 21/311* (2006.01)
*H01L 21/8234* (2006.01)
*H01L 29/66* (2006.01)
*H01L 21/308* (2006.01)

(52) U.S. Cl.
CPC ... *H01L 21/823431* (2013.01); *H01L 21/3086* (2013.01); *H01L 21/31111* (2013.01); *H01L 29/6653* (2013.01); *H01L 29/6656* (2013.01)

(58) Field of Classification Search
CPC ............... H01L 21/31116; H01L 21/0337; H01L 21/31144; H01L 21/76802; H01L 21/0338
USPC ............................................... 438/696, 702
See application file for complete search history.

(56) References Cited

U.S. PATENT DOCUMENTS

| 8,039,179 | B2 | 10/2011 | Shieh et al. |
| 8,202,681 | B2 | 6/2012 | Lin et al. |
| 8,728,332 | B2 | 5/2014 | Lin et al. |
| 8,822,243 | B2 | 9/2014 | Yan et al. |
| 2006/0091468 | A1 | 5/2006 | Liaw |
| 2007/0065990 | A1* | 3/2007 | Degroote ............ H01L 21/0337 438/142 |
| 2011/0281208 | A1 | 11/2011 | Lin et al. |
| 2012/0278776 | A1 | 11/2012 | Lei et al. |
| 2013/0295769 | A1 | 11/2013 | Lin et al. |
| 2013/0320451 | A1 | 12/2013 | Liu et al. |
| 2014/0193974 | A1 | 7/2014 | Lee et al. |
| 2014/0215421 | A1 | 7/2014 | Chen et al. |
| 2014/0242794 | A1 | 8/2014 | Lin et al. |
| 2014/0264760 | A1 | 9/2014 | Chang et al. |
| 2014/0264899 | A1 | 9/2014 | Chang et al. |
| 2014/0273442 | A1 | 9/2014 | Liu et al. |
| 2014/0273446 | A1 | 9/2014 | Huang et al. |

* cited by examiner

*Primary Examiner* — Quoc Hoang
(74) *Attorney, Agent, or Firm* — Haynes and Boone, LLP

(57) ABSTRACT

A method for fabricating a semiconductor device includes forming a plurality of first spacers over a substrate. A second spacer of a plurality of second spacers is deposited on sidewalls of each first spacer. In some embodiments, a spacing between adjacent first spacers is configured such that second spacers formed on sidewalls of the adjacent first spacers physically merge to form a merged second spacer. A second spacer cut process may be performed to selectively remove at least one second spacer. In some embodiments, a third spacer of a plurality of third spacers is formed on sidewalls of each second spacer. A third spacer cut process may be performed to selectively remove at least one third spacer. A first etch process is performed on the substrate to form fin regions. The plurality of third spacers mask portions of the substrate during the first etch process.

20 Claims, 11 Drawing Sheets

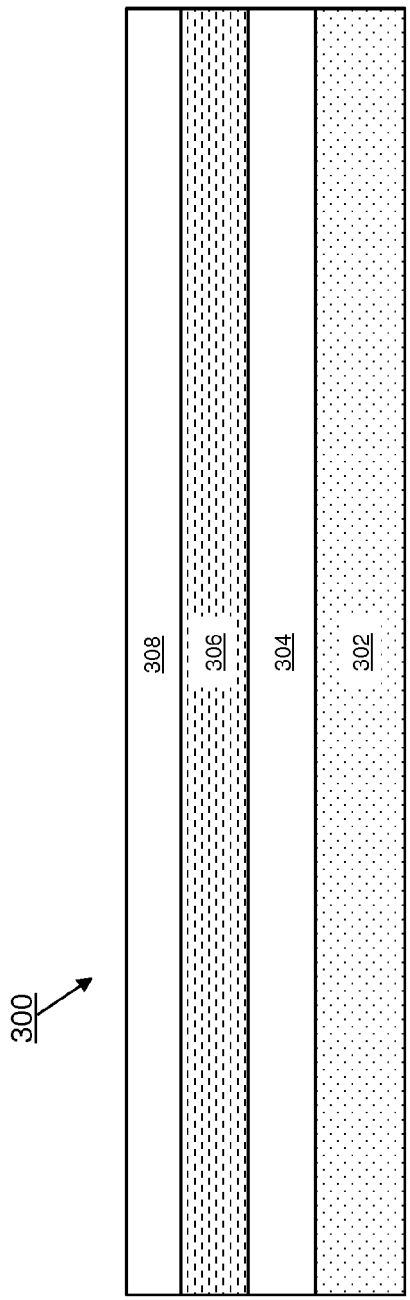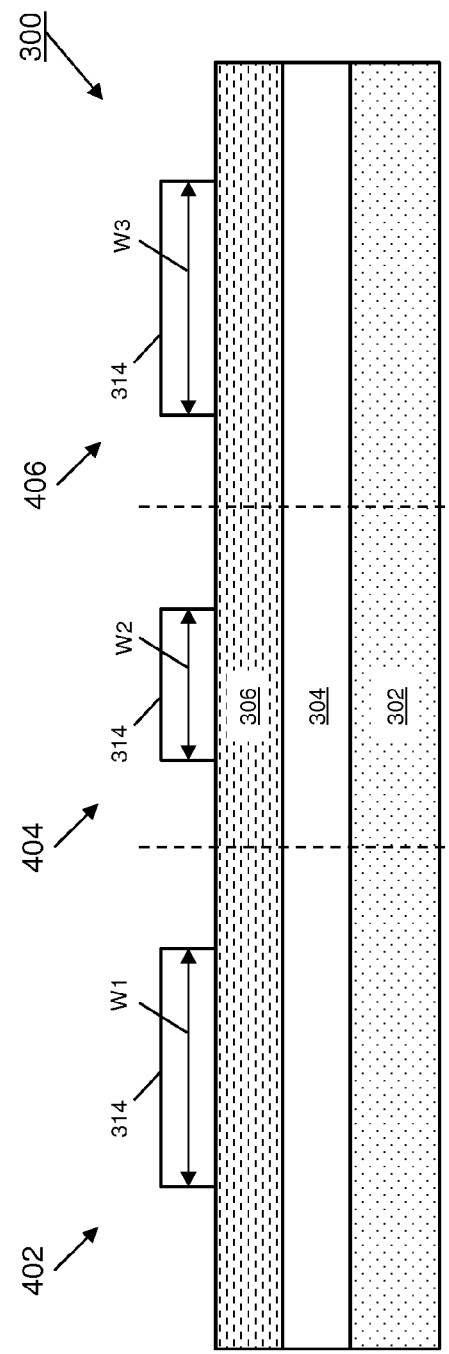

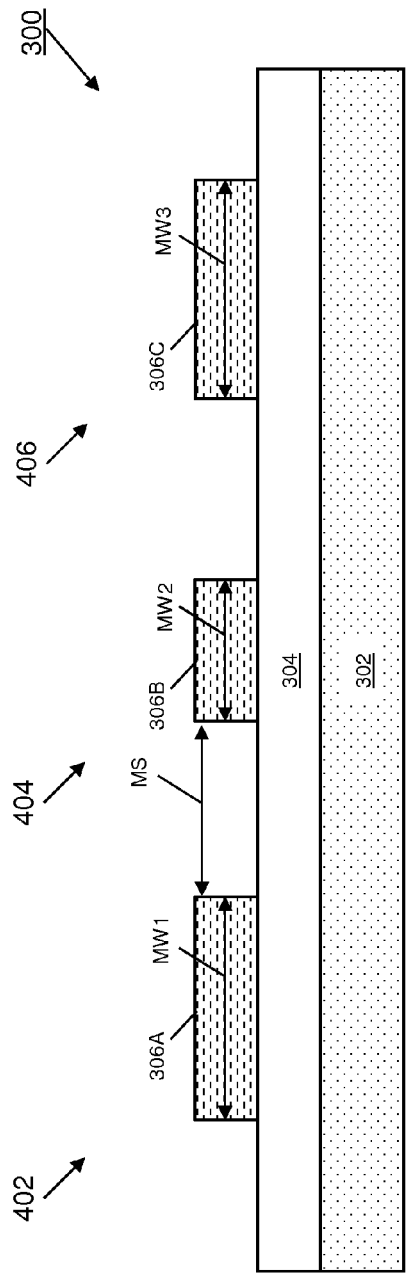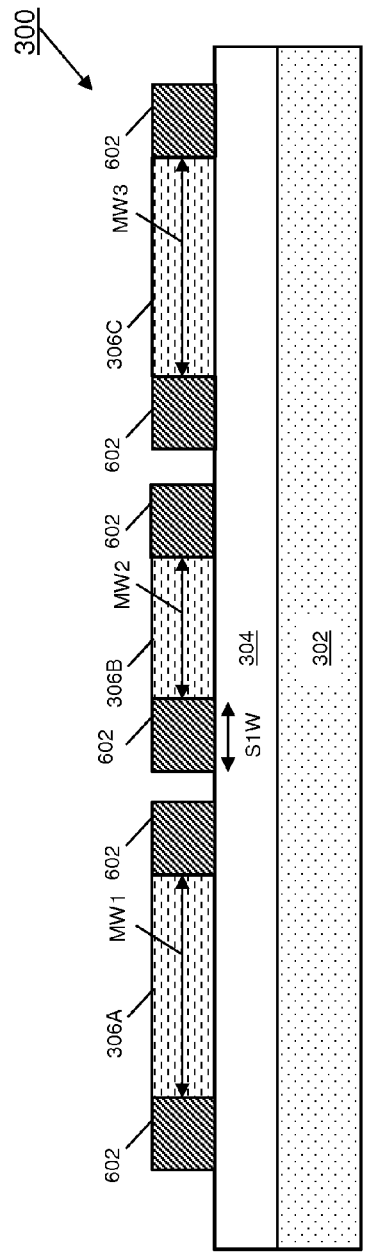

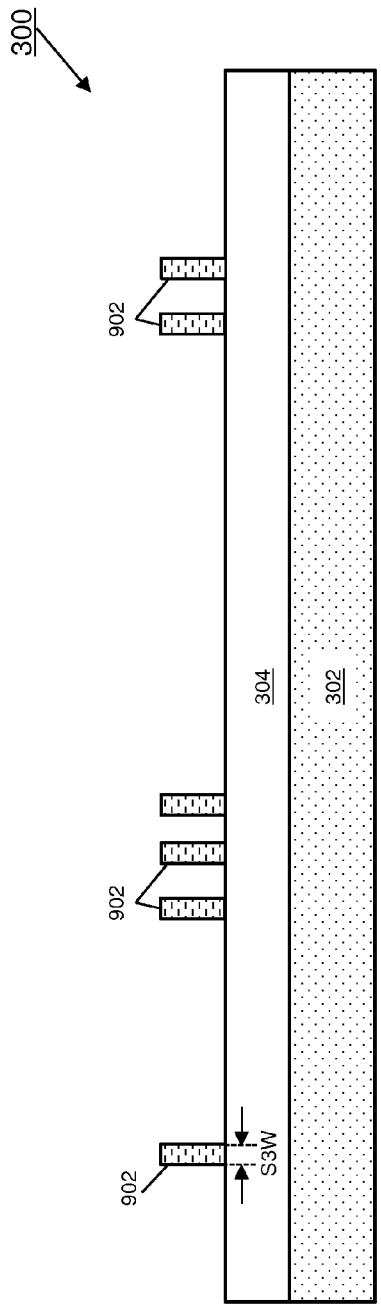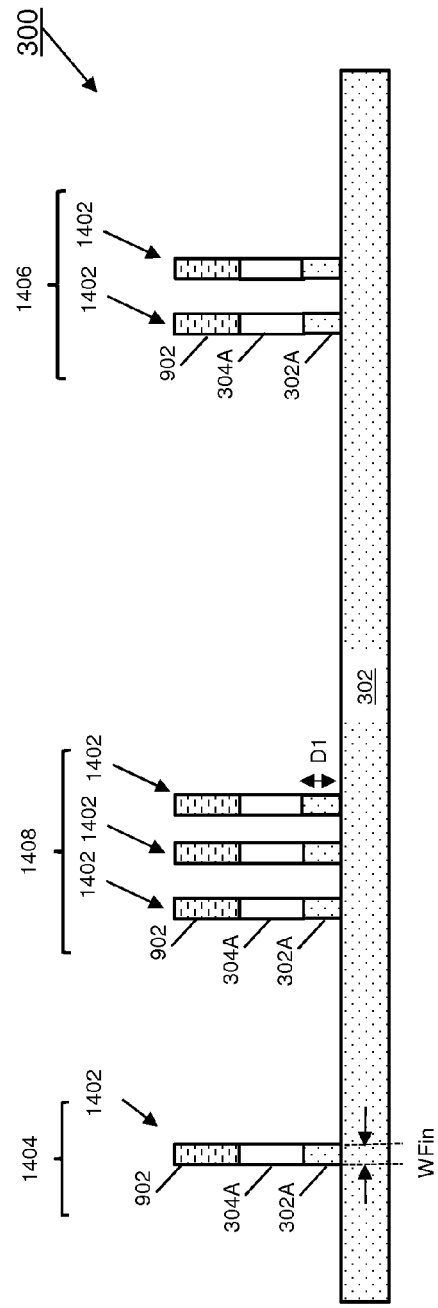

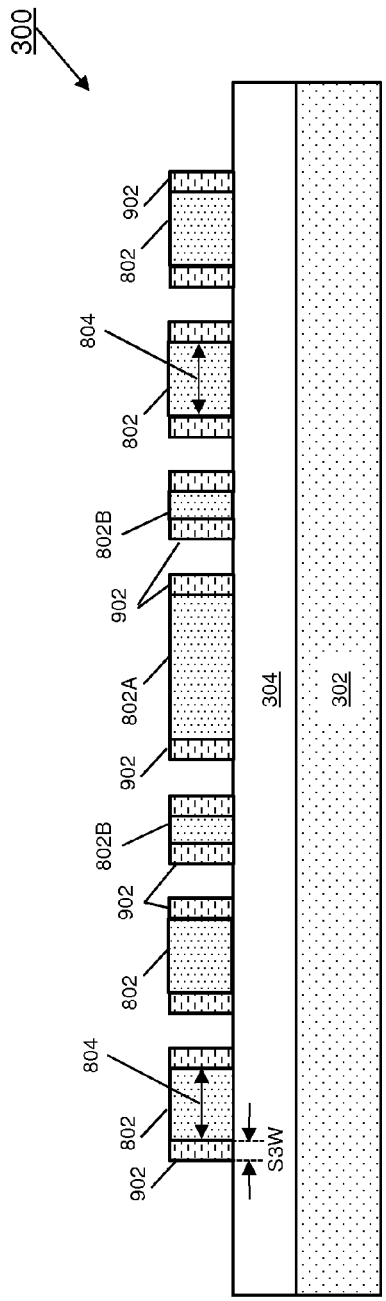
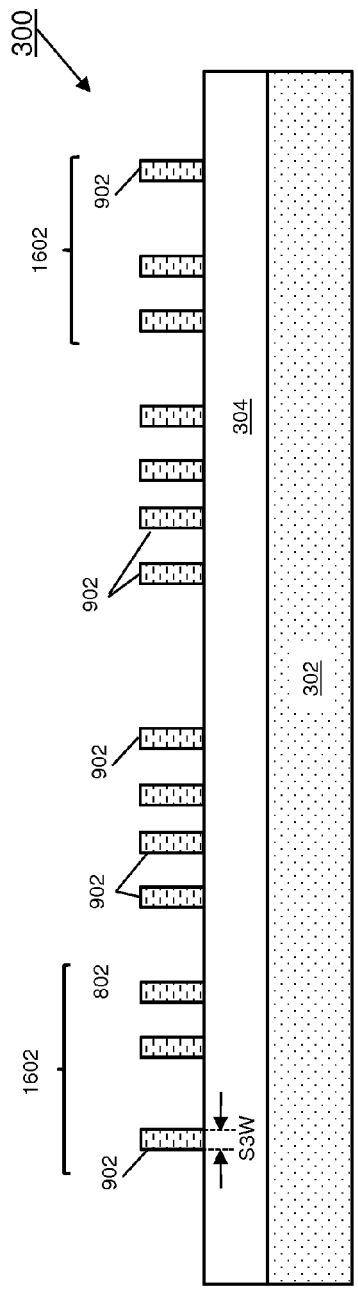
FIG. 15
FIG. 16

FIN PATTERNING METHODS FOR INCREASED PROCESS MARGIN

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) processes and their three-dimensional structure allows them to be aggressively scaled while maintaining gate control and mitigating SCEs. However, continued scaling of FinFET devices requires concurrent improvements in photolithographic processes. Current lithography techniques may be limited, for example, in their alignment precision and repeatability of the equipment used (e.g., a photolithography stepper), as well as in the minimum feature size that may be printed. Thus, current lithography tools may not provide sufficient process margin, in particular when employing existing photolithography processes. As a result, FinFET critical dimensions (CDs) may be directly impacted by pattern misalignment, or other lithography errors, which can result in degraded device performance and/or device failure. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-18 illustrate cross-sectional views of an embodiment of a device 300 fabricated according to one or more aspects of the method of FIG. 2.

DETAILED DESCRIPTION

Figure 1:
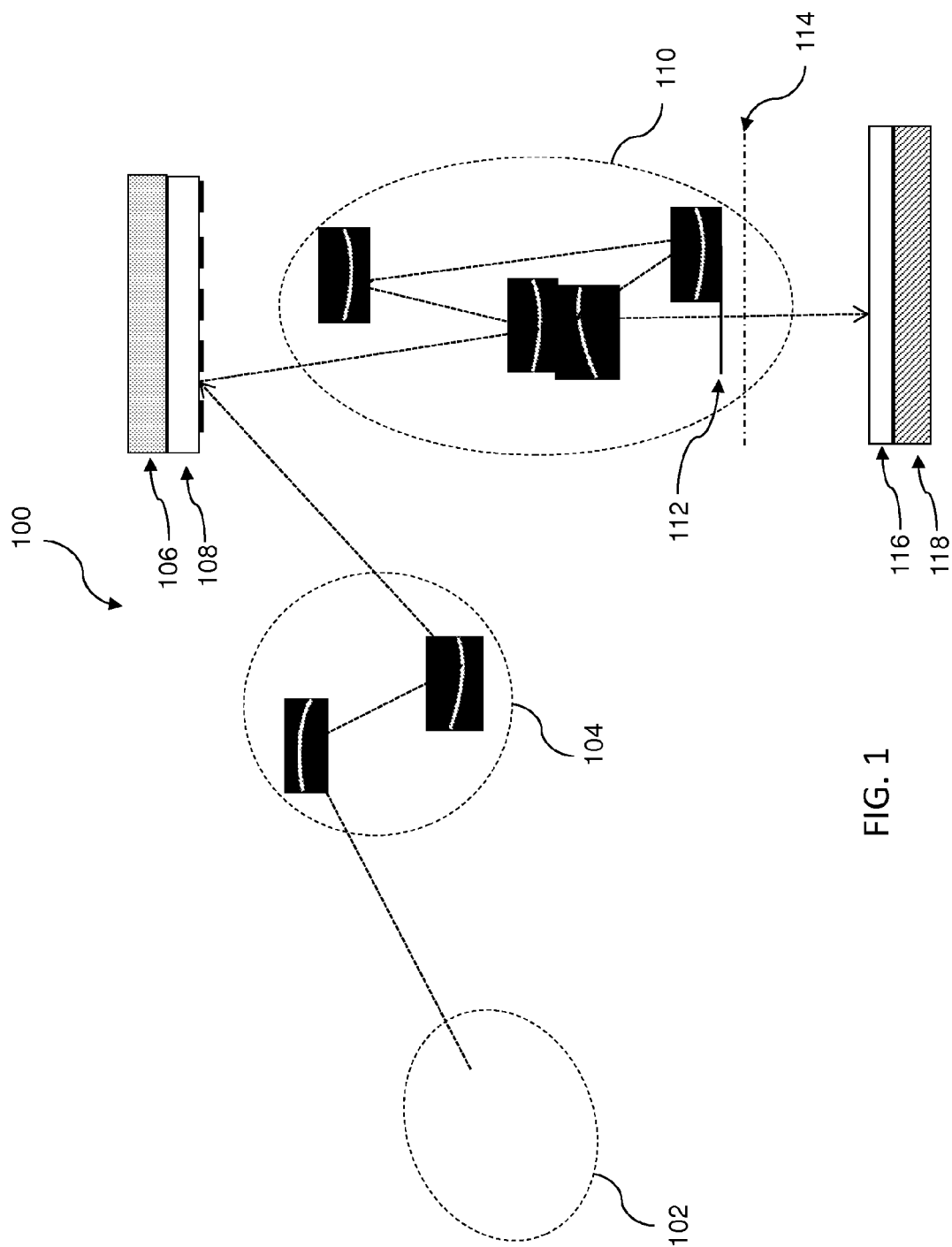
FIG. 1 is a schematic view of a lithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, throughout the present disclosure, the terms "mask", "photomask", and "reticle" may be used interchangeably to refer to a lithographic template, such as an EUV mask.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other examples of semiconductor devices that may benefit from aspects of the present disclosure. For example, some embodiments as described herein may also be applied to gate-all-around (GAA) devices, Omega-gate (Ω-gate) devices, or Pi-gate (Π-gate) devices.

The present disclosure relates to the patterning of a semiconductor substrate using one or more lithography processes. The techniques of the present disclosure apply equally to a wide range of lithographic techniques, as known in the art. For context, a photolithographic system suitable for use in implementing one such lithographic technique is described with reference to FIG. 1. In particular, FIG. 1 illustrates a schematic view of a lithography system 100, in accordance with some embodiments. The lithography system 100 may also be generically referred to as a scanner that is operable to perform lithographic processes including exposure with a respective radiation source and in a particular exposure mode. In at least some of the present embodiments, the lithography system 100 includes an extreme ultraviolet (EUV) lithography system designed to expose a resist layer by EUV light. Inasmuch, in various embodiments, the resist layer includes a material sensitive to the EUV light (e.g., an EUV resist). The lithography system 100 of FIG. 1 includes a plurality of subsystems such as a radiation source 102, an illuminator 104, a mask stage 106 configured to receive a mask 108, projection optics 110, and a substrate stage 118 configured to receive a semiconductor substrate 116. A general description of the operation of the lithography system 100 may be given as follows: EUV light from the radiation source 102 is directed toward the illuminator 104 (which includes a set of reflective mirrors) and projected onto the reflective mask 108. A reflected mask image is directed toward the projection optics 110, which focuses the EUV light and projects the EUV light onto the semiconductor substrate 116 to expose an EUV resist layer deposited thereupon. Additionally, in various examples, each subsystem of the lithography system 100 may be housed in, and thus operate within, a high-vacuum environment, for example, to reduce atmospheric absorption of EUV light.

In the embodiments described herein, the radiation source 102 may be used to generate the EUV light. In some embodiments, the radiation source 102 includes a plasma source, such as for example, a discharge produced plasma (DPP) or a laser produced plasma (LPP). In some examples, the EUV light may include light having a wavelength ranging from about 1 nm to about 100 nm. In one particular example, the radiation source 102 generates EUV light with a wavelength centered at about 13.5 nm. Accordingly, the radiation source 102 may also be referred to as an EUV radiation source 102. In some embodiments, the radiation source 102 also includes a collector, which may be used to collect EUV light generated from the plasma source and to direct the EUV light toward imaging optics such as the illuminator 104.

As described above, light from the radiation source 102 is directed toward the illuminator 104. In some embodiments, the illuminator 104 may include reflective optics (e.g., for the EUV lithography system 100), such as a single mirror or a mirror system having multiple mirrors in order to direct light from the radiation source 102 onto the mask stage 106, and particularly to the mask 108 secured on the mask stage 106. In some examples, the illuminator 104 may include a zone plate, for example, to improve focus of the EUV light. In some embodiments, the illuminator 104 may be configured to shape the EUV light passing therethrough in accordance with a particular pupil shape, and including for example, a dipole shape, a quadrapole shape, an annular shape, a single beam shape, a multiple beam shape, and/or a combination thereof. In some embodiments, the illuminator 104 is operable to configure the mirrors (i.e., of the illuminator 104) to provide a desired illumination to the mask 108. In one example, the mirrors of the illuminator 104 are configurable to reflect EUV light to different illumination positions. In some embodiments, a stage prior to the illuminator 104 may additionally include other configurable mirrors that may be used to direct the EUV light to different illumination positions within the mirrors of the illuminator 104. In some embodiments, the illuminator 104 is configured to provide an on-axis illumination (ONI) to the mask 108. In some embodiments, the illuminator 104 is configured to provide an off-axis illumination (OAI) to the mask 108. It should be noted that the optics employed in the EUV lithography system 100, and in particular optics used for the illuminator 104 and the projection optics 110, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 100 also includes the mask stage 106 configured to secure the mask 108. Since the lithography system 100 may be housed in, and thus operate within, a high-vacuum environment, the mask stage 106 may include an electrostatic chuck (e-chuck) to secure the mask 108. As with the optics of the EUV lithography system 100, the mask 108 is also reflective. As illustrated in the example of FIG. 1, light is reflected from the mask 108 and directed towards the projection optics 110, which collects the EUV light reflected from the mask 108. By way of example, the EUV light collected by the projection optics 110 (reflected from the mask 108) carries an image of the pattern defined by the mask 108. In various embodiments, the projection optics 110 provides for imaging the pattern of the mask 108 onto the semiconductor substrate 116 secured on the substrate stage 118 of the lithography system 100. In particular, in various embodiments, the projection optics 110 focuses the collected EUV light and projects the EUV light onto the semiconductor substrate 116 to expose an EUV resist layer deposited on the semiconductor substrate 116. As described above, the projection optics 110 may include reflective optics, as used in EUV lithography systems such as the lithography system 100. In some embodiments, the illuminator 104 and the projection optics 110 are collectively referred to as an optical module of the lithography system 100.

In some embodiments, the lithography system 100 also includes a pupil phase modulator 112 to modulate an optical phase of the EUV light directed from the mask 108, such that the light has a phase distribution along a projection pupil plane 114. In some embodiments, the pupil phase modulator 112 includes a mechanism to tune the reflective mirrors of the projection optics 110 for phase modulation. For example, in some embodiments, the mirrors of the projection optics 110 are configurable to reflect the EUV light through the pupil phase modulator 112, thereby modulating the phase of the light through the projection optics 110. In some embodiments, the pupil phase modulator 112 utilizes a pupil filter placed on the projection pupil plane 114. By way of example, the pupil filter may be employed to filter out specific spatial frequency components of the EUV light reflected from the mask 108. In some embodiments, the pupil filter may serve as a phase pupil filter that modulates the phase distribution of the light directed through the projection optics 110.

As discussed above, the lithography system 100 also includes the substrate stage 118 to secure the semiconductor substrate 116 to be patterned. In various embodiments, the semiconductor substrate 116 includes a semiconductor wafer, such as a silicon wafer, germanium wafer, silicon-germanium wafer, III-V wafer, or other type of wafer as known in the art. The semiconductor substrate 116 may be coated with a resist layer (e.g., an EUV resist layer) sensitive to EUV light. In the embodiments described herein, the various subsystems of the lithography system 100, including those described above, are integrated and are operable to perform lithography exposing processes including EUV lithography processes. To be sure, the lithography system 100 may further include other modules or subsystems which may be integrated with (or be coupled to) one or more of the subsystems or components described herein.

Figure 2:
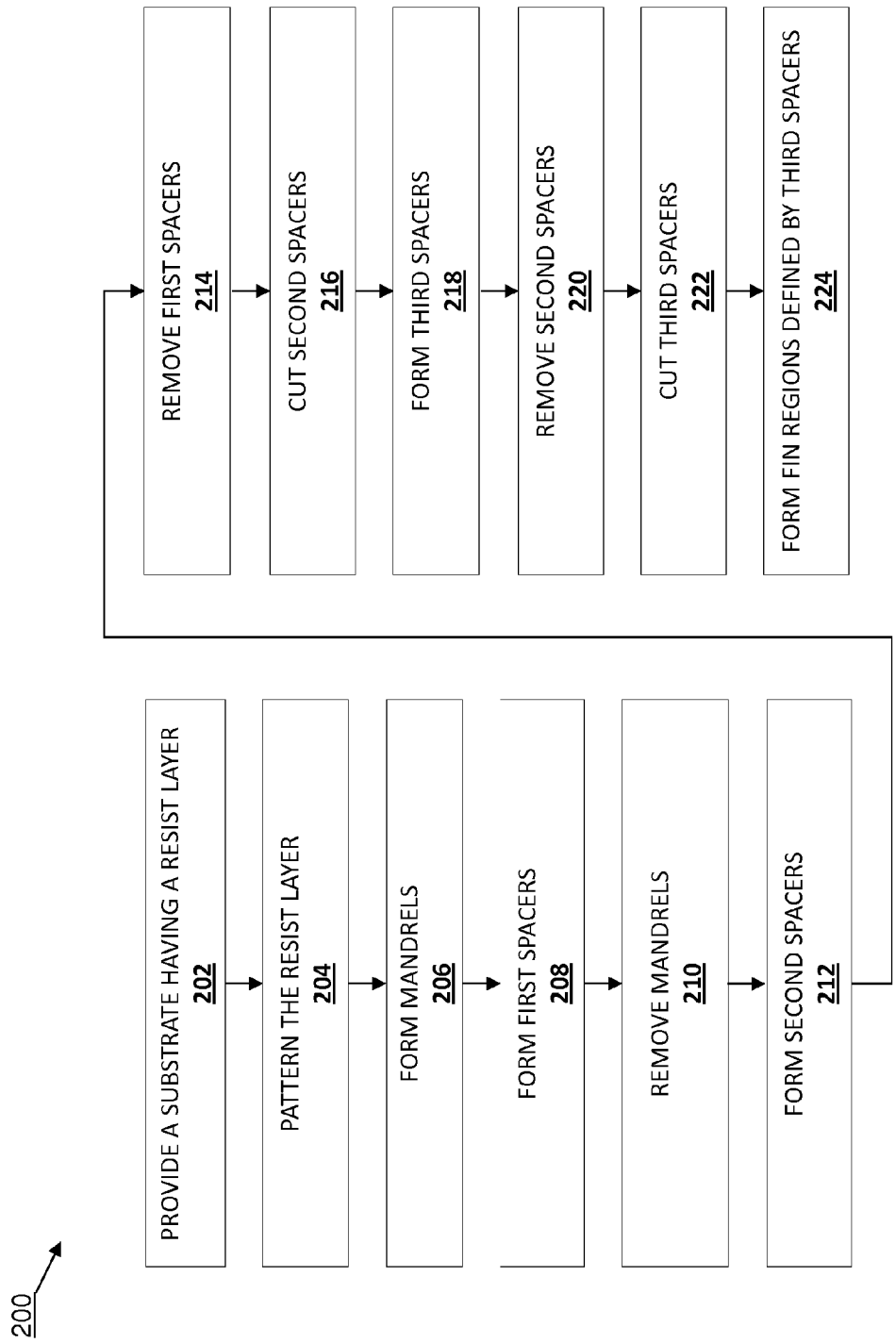
FIG. 2 is a flow chart of a method of fabricating a FinFET device or portion thereof according to one or more aspects of the present disclosure.
Figure 7:
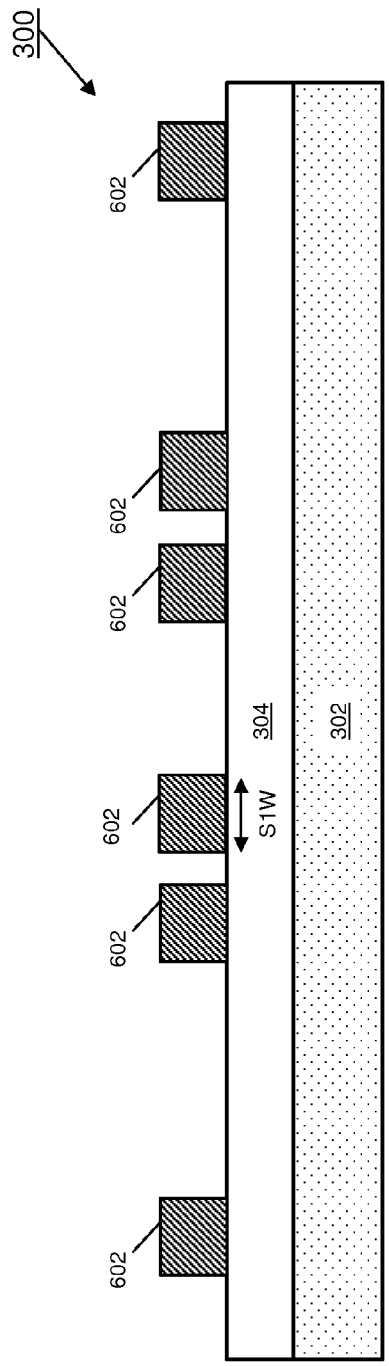
Figure 8:
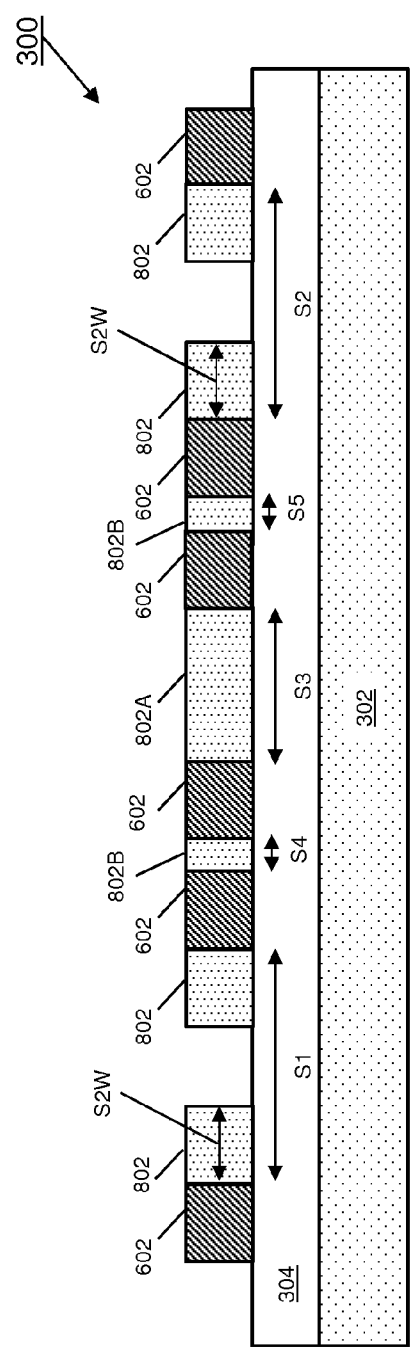
Figure 9:
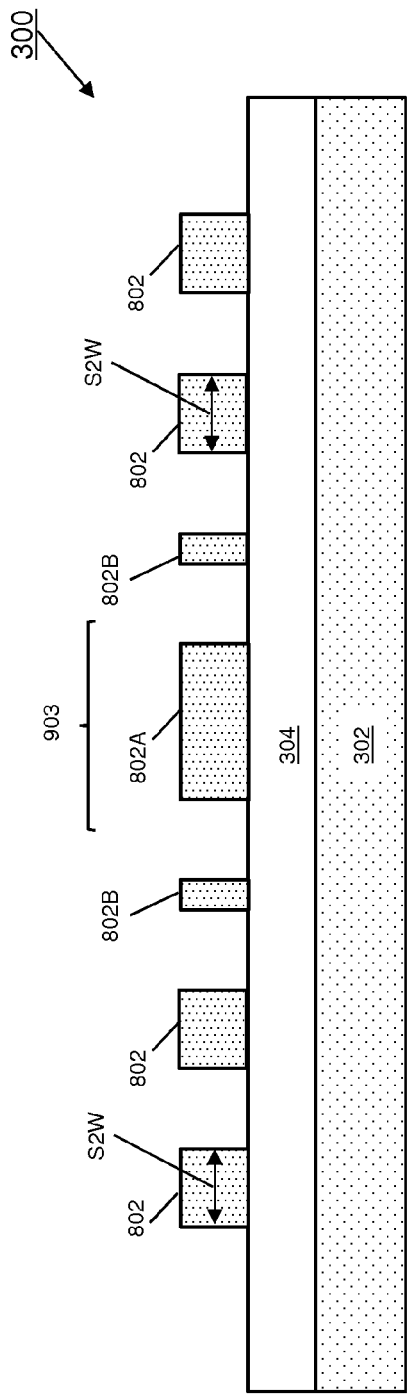
Figure 10:
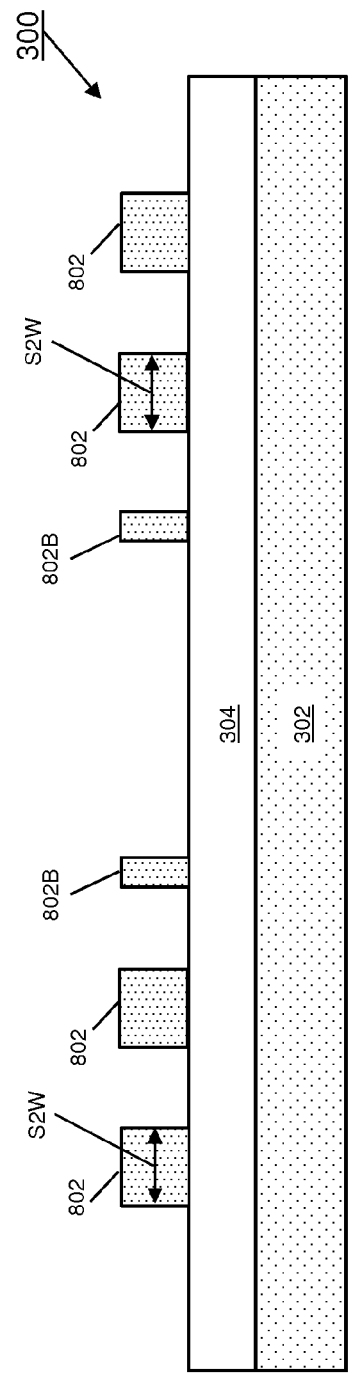
Figure 11:
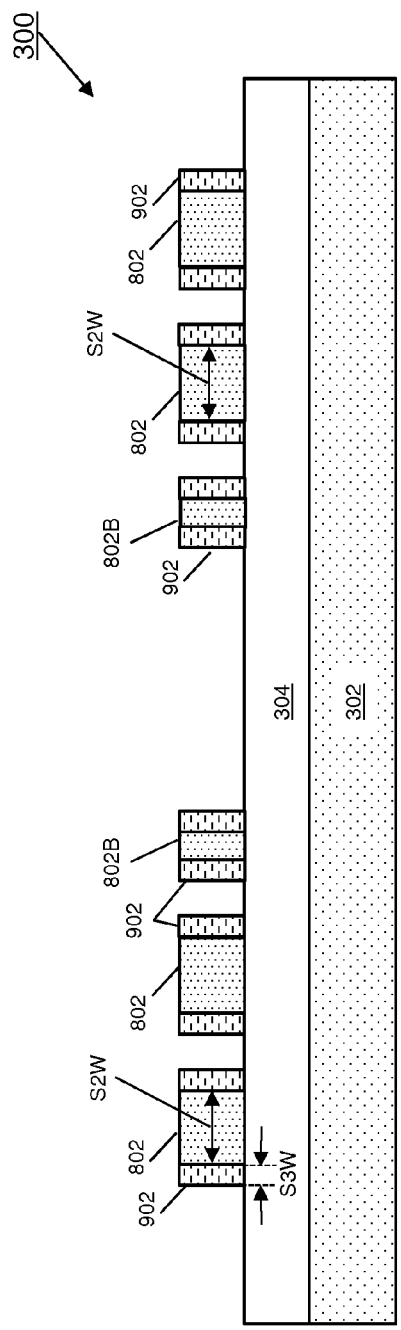
Figure 12:
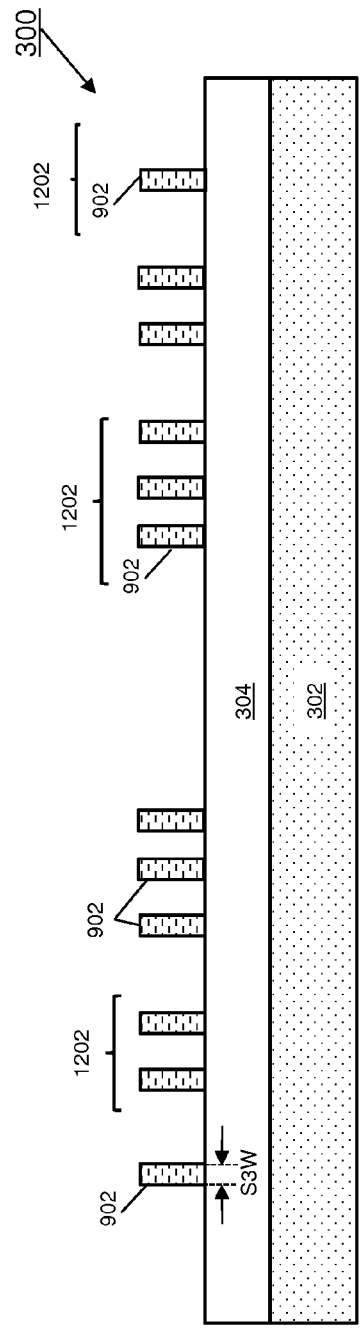

A technique for lithographic patterning, which may be performed using the lithography system 100 and/or any other suitable direct-write or photolithographic system is described below with reference to FIGS. 2-19. Referring to FIG. 2, illustrated therein is a method 200 of semiconductor fabrication including fin patterning on a substrate. In some examples, a self-aligned process may be used during the fin patterning process. As used herein, the term "self-aligned" or "self-aligned process" is used to describe a process by which an already existing substrate feature is used as a mask to pattern a subsequent layer or feature. For example, a conventional self-aligned gate process includes use of a transistor gate stack as a mask for subsequent formation of adjacent source/drain features (e.g., formed via ion implantation) on either side of the gate stack. As device geometries continue to scale down, photolithographic processes become increasingly challenging. For instance, photolithography processes may be limited, for example, in their alignment precision and repeatability of the equipment used (e.g., a photolithography stepper), as well as in the minimum feature size that may be printed. As such, current lithography tools may not provide sufficient process margin, in particular when employing existing photolithography processes. In addition, photolithographic patterning of FinFET critical dimensions (CDs) may be directly impacted by pattern misalignment, or other lithography errors, which can result in degraded device performance and/or device failure. Embodiments of the present disclosure, as discussed below, utilize a hybrid lithographic patterning process which may include one or more of a triple spacer process, a spacer merge process, and a spacer cut process in the formation of FinFET devices to mitigate at least some of the problems associated with lithographic patterning of highly-scaled structures and devices. It is understood that the method 200 includes steps having features of a complementary metal-oxide-semiconductor (CMOS) technology process flow and thus, are only described briefly herein. Additional steps may be performed before, after, and/or during the method 200.

FIGS. 3-18 are cross-sectional views of an embodiment of a semiconductor device 300 according to various stages of the method 200 of FIG. 2. In particular, FIGS. 3-14 illustrate examples of embodiments where groups of one, two, three fins are formed for subsequent FinFET formation having one, two, or three fin elements, respectively. FIGS. 15-18 illustrate examples of embodiments where groups of four fins are formed for subsequent FinFET formation having four fin elements. It is understood that parts of the semiconductor device 300 may be fabricated by a CMOS technology process flow, and thus some processes are only briefly described herein. Further, the semiconductor device 300 may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the semiconductor device 300 includes a plurality of semiconductor devices (e.g., transistors), including PFETs, NFETs, etc., which may be interconnected. Moreover, it is noted that the process steps of method 200, including any descriptions given with reference to FIGS. 3-18, are merely exemplary and are not intended to be limiting beyond what is specifically recited in the claims that follow.

The method 200 begins at block 202 where a substrate including a resist layer is provided. Referring to the examples of FIG. 2 and FIG. 3, in an embodiment of block 202, a device 300 including a substrate 302 is provided. In some embodiments, the substrate 302 may be a semiconductor substrate such as a silicon substrate. The substrate 302 may include various layers, including conductive or insulating layers formed on a semiconductor substrate. The substrate 302 may include various doping configurations depending on design requirements as is known in the art. The substrate 302 may also include other semiconductors such as germanium (Ge), silicon carbide (SiC), silicon germanium (SiGe), or diamond. Alternatively, the substrate 302 may include a compound semiconductor and/or an alloy semiconductor. By way of example, in some embodiments, the substrate 302 may also include silicon phosphide (SiP), silicon phosphorus carbide (SiPC), a silicon-on-insulator (SOI) structure, a SiGe-on-SOI structure, a Ge-on-SOI structure, a III-VI material, or a combination of any of the above materials. Further, the substrate 302 may optionally include an epitaxial layer (epi-layer), may be strained for performance enhancement, and/or have other suitable enhancement features.

As shown in the example of FIG. 3, the substrate 302 may also include various material layers formed upon it. In the illustrated embodiment, the device 300 includes a material layer 304 to be patterned and a sacrificial layer 306 disposed on the material layer 304. It will be recognized that the substrate 302 may have any number of material layers, masking layers, sacrificial layers, resist layers and/or other layers formed upon it. Suitable materials for these layers may be selected, in part, based on a material etch selectivity. For example, the material layer 304 to be patterned and the sacrificial layer 306 may be structured to have different etch sensitivities such that each layer can be removed using a corresponding etchant without significant etching of the other layer. For example, a first and second material may have a 10:1 sensitivity ratio to a given etchant, thus allowing the first material to be etched to a selected depth while only removing about 10% as much of the second material. Accordingly, in various embodiments, the material layer 304 includes a semiconductor and/or a dielectric material, such as a semiconductor oxide, semiconductor nitride, and/or semiconductor oxynitride, while the sacrificial layer 306 includes a different material having a different etch sensitivity, such as a different semiconductor, semiconductor oxide, semiconductor nitride, semiconductor oxynitride, and/or other dielectric. In one such embodiment, the material layer 304 includes silicon oxide and the sacrificial layer 306 includes amorphous silicon, as these materials exhibit different etch sensitivity. In various embodiments, each of the material layer 304 and sacrificial layer 306 may be deposited by a suitable deposition process, such as chemical vapor deposition (CVD), physical vapor deposition (PVD), atomic layer deposition (ALD), thermal oxidation, e-beam evaporation, or any combination thereof. In various embodiments, a lithographically-sensitive resist (e.g., photoresist) 308 may be formed on the sacrificial layer 306. In some embodiments, the resist 308 includes a material sensitive to the EUV light (e.g., an EUV resist), where the resist is exposed by an EUV lithography system (e.g., the lithography system 100).

The method 200 proceeds to block 204 where the resist 308 is patterned. Referring to block 204 and to FIG. 4, the resist layer 308 is patterned to form a patterned layer 314 of the resist 308 (FIG. 3). Patterning may be performed using any suitable lithographic technique including photolithography and/or direct-write lithography. An exemplary photolithographic patterning process includes soft baking of the resist layer 308, mask aligning, exposure, post-exposure baking, developing the resist layer 308, rinsing, and drying (e.g., hard baking). An exemplary direct-write patterning process includes scanning the surface of the resist layer 308 with an e-beam or other energy source while varying the intensity of the energy source in order to vary the dosage received by various regions of the resist layer 308. As evident in the following description, the final pattern formed in the material layer 304 is based upon this first pattern of the patterned layer 314, but other intermediate patterning steps alter the pattern before the method 200 is complete. In addition, the embodiment of FIG. 4 illustrates a first region 402, in which the shapes of the first pattern have a first pitch and width (e.g., a minimum pitch and width), a second region 404, in which the shapes have a second pitch and width, and a third region 406, in which the shapes have a third pitch and width, to demonstrate the flexibility of the present techniques to form features having a variety of spacings. In the illustrated embodiment, the patterned layer 314 in the first region 402 has a width 'W1', the patterned layer 314 in the second region 404 has a width 'W2', and the patterned layer 314 in the third region 404 has a width 'W3'. In some examples, each of the widths W1, W2, and W3 may be configured so as to provide a desired width and spacing for subsequently formed mandrels, as described below.

The method 200 proceeds to block 206 where mandrels are formed. Referring to block 206 and FIG. 5, the pattern defined by the patterned layer 314 (FIG. 4) is transferred to the sacrificial layer 306 to form mandrels 306A, 306B, and 306C in the sacrificial layer 306. Mandrels 306A, 306B, 306C serve as temporary support structures for the formation of subsequently formed first spacers, as described below. The transfer of the pattern, from the patterned resist layer 314, to the sacrificial layer 306 may include one or more etching processes. Thus, in various embodiments, the patterned layer 314 serves a mask for the one or more etching processes. In various examples, the pattern transfer (to the sacrificial layer 306) may include any suitable etching process such as wet etching, dry etching, and/or other suitable technique. The etching process and/or etching reagents may be selected so as to etch the sacrificial layer 306 without significant etching of the material layer 304. Any remaining resist (e.g., of the patterned layer 314) may be stripped following the patterning of the sacrificial layer 306. In addition, as shown in FIG. 5, the mandrels 306A, 306B, 306C have widths MW1, MW2, MW3, respectively, which are substantially equal to widths W1, W2, W3 of the patterned layer 314. In some examples, each of the mandrel widths MW1, MW2, MW3 may be configured (e.g., by appropriate patterning of the patterned layer 314) so as to provide a desired pitch/spacing between subsequently formed spacers, as described below. Additionally, a mandrel spacing 'MS' between adjacent mandrels may be defined, where such mandrel spacing may be configured to provide a desired pitch/spacing between subsequently formed spacers.

The method 200 proceeds to block 208 where first spacers are formed. Referring to block 208 and to FIG. 6, first spacers 602 are formed on the sidewalls of the mandrels 306A, 306B, 306C. Owing in part to their shape, the first spacers 602 may be referred to as fins. The material of the first spacer 602 fins may include any suitable semiconductor, a dielectric material such as silicon oxide (SiO$_2$), silicon nitride (Si$_3$N$_4$), silicon oxynitride (SiON), a high-K dielectric material, silicon carbide, or a combination thereof, and/or other suitable material and may be selected to have a different etchant sensitivity as compared to the material layer 304 and the sacrificial layer 306 (i.e., the material used to form mandrels 306A, 306B, 306C). For example, in at least some embodiments, the material layer 304 includes silicon oxide, the sacrificial layer 306 (i.e., the mandrels 306A, 306B, 306C) includes amorphous silicon, and the first spacer 602 fins include silicon nitride.

One technique for forming the first spacer 602 fins on the sidewalls of the mandrels 306A, 306B, 306C includes depositing the material of first spacer 602 fins on the sacrificial layer 306 (i.e., over the patterned mandrels 306A, 306B, 306C) and on the material layer 304 by any suitable process including atomic layer deposition (ALD), chemical vapor deposition (CVD), plasma-enhanced CVD (PE CVD), and/or other suitable deposition techniques. Removal of extraneous deposited first spacer 602 material from horizontal surfaces of the material layer 304 and from top surfaces of the mandrels 306A, 306B, 306C may be performed by an anisotropic etch process (e.g., plasma etch process). In this way, only those portions of the first spacer 602 material deposited on the sidewalls of the mandrels 306A, 306B, 306C remains. In various examples, the deposition thickness (e.g., of the first spacer 602 material) and the etching technique are tuned to control a width of the first spacer 602 fins (indicated as spacer one width 'S1W' in FIG. 6). The width of these first spacer 602 fins is correlated to the thickness of the features to be formed in the material layer 304, and, in some embodiments, deposition and etching can be manipulated for more precise control of feature thickness than can be achieved by lithography alone.

The method 200 proceeds to block 210 where the mandrels are removed. Referring to block 210 and FIG. 7, the mandrels 306A, 306B, 306C (FIG. 6) are selectively removed (e.g., by a wet or dry etching process), leaving the first spacers 602 behind. In various embodiments, the etching technique and etchant chemistry may utilize the etching selectivity of the sacrificial layer 306 (from which the mandrels were formed) to remove the mandrels without significant etching of the first spacers 602 or the material layer 304. In some embodiments, after removal of the mandrels 306A, 306B, 306C, the first spacers 602 may be used to define second spacers, as described below.

The method proceeds to block 212 where second spacers are formed. Referring to block 212 and FIG. 8, second spacer material is formed on the sidewalls of the first spacers 602 to form a set of second spacers 802. The material of the second spacer 802 may include any suitable semiconductor, a dielectric material such as silicon oxide (SiO$_2$), silicon nitride (Si$_3$N$_4$), silicon oxynitride (SiON), a high-K dielectric material, silicon carbide, or a combination thereof, and/or other suitable material and may be selected to have different etch sensitivity than the first spacers 602 and the material layer 304. In an exemplary embodiment, the second spacers 802 include amorphous silicon to provide the desired etch selectivity. Similar to formation of the first spacers 602, the material of the second spacers 802 may be formed by a deposition and etch-back process. In that regard, the second spacers 802 may be deposited conformally over the substrate 302 by any suitable process including ALD, CVD, PE CVD, and/or other suitable deposition technique and subsequently etched using an anisotropic etch process (e.g., a plasma etch process). In various examples, the deposition thickness (e.g., of the second spacer 802 material) and the etching technique are tuned to control a width of the second spacer 802 (indicated as spacer two width 'S2W' in FIG. 8), as this is correlated to the thickness of those features eventually formed in the material layer 304 as well as the spacing between these features. It should be noted that the spacer two width 'S2W' indicated may be a nominal target width. By way of illustration, the actual width of a given spacer of the second spacers 802 depends in part on the spacing between the first spacers 602. For example, at a sufficiently large spacing 'S1' or 'S2' between adjacent first spacers 602, adjacent second spacers 802 remain separate and their width is determined by the deposition thickness (e.g., of the first spacer 802 material) and subsequent etch-back process, and as such may be substantially equal to S2W. In addition, at a particular spacing 'S3' between adjacent first spacers 602, adjacent second spacers 802 may merge to form a single, merged spacer 802A. In some embodiments, a width of the merged spacer 802A may be equal to about twice the width of S2W. In some embodiments, the width of the merged spacer 802A may have a value between S2W and 2*S2W, for example depending on the spacing S3. As described in more detail below, the merged spacer 802A serves to enlarge a pitch of subsequently patterned features in the material layer 304. For closer spacings between adjacent first spacers 602 (e.g., spacing 'S4' or 'S5'), second spacers 802B may be formed in recesses defined by the adjacent first spacers 602. In the examples of spacings S4 or S5, the spacer two width may be less than S2W.

It should be noted that although the illustrative 'spacer merge' process is described above with reference to the second spacers (e.g., second spacer 802A), it will be understood that such a spacer merge process may equally be applied to the first spacers 602. For example, at a particular mandrel spacing 'MS' between adjacent mandrels (FIG. 5), adjacent first spacers 602 may merge to form a single, merged first spacer. In some embodiments, a width of such a merged first may be equal to about twice the width of S1W. In some embodiments, the width of such a merged first spacer may have a value between S1W and 2*S1W, for example depending on the spacing between adjacent mandrels 'MS'.

The method 200 proceeds to block 214 where the first spacers are removed. Referring to block 214 and FIG. 9, the first spacers 602 (FIG. 8) are selectively removed (e.g., by a wet or dry etching process), leaving the second spacers 802, 802A, 802B behind. In various embodiments, the etching technique and etchant chemistry may utilize the etching selectivity of the material used to form the first spacers 602 to remove the first spacers 602 without significant etching of the second spacers 802, 802A, 802B or the material layer 304. In some embodiments, after removal of the first spacers 602, the second spacers 802, 802A, 802B may be used to define third spacers, as described below.

The method proceeds to block 216 where the second spacers are cut. Referring to block 216 and FIGS. 9/10, a portion of the second spacer 903 (in the illustrated example, including the merged second spacer 802A) is selectively removed leaving behind other portions of the second spacer 802, 802B. Any suitable etching technique may be used to selectively remove the selected portion 903 of the second spacer including wet etching, dry etching, and/or other suitable techniques and the etching technique and etchant chemistry may utilize the etching selectivity of the second spacer material to remove the second spacer material without significant etching of the surrounding structures. In some embodiments, the portion of the second spacer 903 which is selected to be cut, may be defined by a lithography process, for example, including resist deposition, exposure, and development, where areas to be cut are free from the patterned resist, while areas not to be cut may be protected by the patterned resist. In some examples, cutting the portion of the second spacer 903 prevents corresponding features from being formed in the material layer 304. In various examples, other portions of the second spacer may alternatively be selected to be cut (e.g., portions including second spacer 802 and/or 802B), depending on a desired feature(s) to be patterned into the material layer 304. In some embodiments, the second spacer cut of block 216 may be omitted.

The method proceeds to block 218 where third spacers are formed. Referring to block 218 and FIG. 11, third spacer material is formed on the sidewalls of the remaining second spacers 802, 802B to form a set of third spacers 902. The material of the third spacer 902 may include any suitable semiconductor, a dielectric material such as silicon oxide ($SiO_2$), silicon nitride ($Si_3N_4$), silicon oxynitride (SiON), a high-K dielectric material, silicon carbide, or a combination thereof, and/or other suitable material and may be selected to have different etch sensitivity than the second spacers 802, 802A, 802B and the material layer 304. Similar to formation of the first spacers 602 and the second spacers 802, 802A, 802B, the material of the third spacers 902 may be formed by a deposition and etch-back process. In that regard, the third spacers 902 may be deposited conformally over the substrate 302 by any suitable process including ALD, CVD, PE-CVD, and/or other suitable deposition technique and subsequently etched using an anisotropic etch process (e.g., a plasma etch process). In various examples, the deposition thickness (e.g., of the third spacer 902 material) and the etching technique are tuned to control a width of the third spacers 902 (indicated as spacer three width 'S3W' in FIG. 11), as this is correlated to the thickness of those features eventually formed in the material layer 304 as well as the spacing between these features. In various embodiments, the width of the third spacers 902 S3W serves to define a width of subsequently patterned fin regions formed within the material layer 304, as described below. In some examples, the width 904 of the third spacers S3W is about 6 nm.

The method 200 proceeds to block 220 where the second spacers are removed. Referring to block 220 and FIG. 12, the second spacers 802, 802B (FIG. 11) are selectively removed (e.g., by a wet or dry etching process), leaving the third spacers 902 behind. In various embodiments, the etching technique and etchant chemistry may utilize the etching selectivity of the material used to form the third spacers 902 to remove the second spacers 802, 802B without significant etching of the third spacers 902 or the material layer 304. In some embodiments, after removal of the second spacers 802, 802B, the third spacers 902 may be used to define fin elements (e.g., for a FinFET) within the material layer 304, as described below.

The method proceeds to block 222 where the third spacers are cut. Referring to block 222 and FIGS. 12/13, portions of the third spacer 1202 may be selectively removed leaving behind other portions of the third spacer 902. Any suitable etching technique may be used to selectively remove the selected portion of the second spacer (e.g., portions 1202) including wet etching, dry etching, and/or other suitable techniques and the etching technique and etchant chemistry may utilize the etching selectivity of the third spacer material to remove the third spacer material without significant etching of the surrounding structures. In some embodiments, the portion of the third spacer (e.g., portion 1202) which is selected to be cut, may be defined by a lithography process, for example, including resist deposition, exposure, and development, where areas to be cut are free from the patterned resist, while areas not to be cut may be protected by the patterned resist. In some examples, cutting the portion of the third spacer prevents corresponding features (e.g., fin features) from being formed in the material layer 304. In various examples, other portions of the third spacer may alternatively be selected to be cut, depending on a desired feature(s) to be patterned into the material layer 304. In some embodiments, the third spacer cut of block 222 may be omitted.

The method proceeds to block 224 where fin regions are formed as defined by the third spacers 902. Referring to the example of FIGS. 13/14, and in an embodiment of block 224, the material layer 304 is etched (e.g., by a wet or dry etch). As shown, the third spacers 902 serve as an etch mask and the pattern defined by the spacers 902 is transferred to the underlying etched material layer 304A. Thereafter, the substrate 302 is etched (e.g., by a wet or dry etch) to form a plurality of fin regions 302A, where the third spacers 902 serve as an etch mask and the pattern defined by the third spacers 902 is transferred to the substrate 302. In some embodiments, the plurality of fin regions 302A is formed by etching the substrate 302 to a depth ($D_1$) of about 20 nm to 70 nm. In some examples, each of the fin regions 302A defines a channel region of a FinFET device, as described below. Thus, as shown in FIG. 14, a plurality of fin stacks 1402 is formed, where each of the plurality of fin stacks 1402 includes the fin region 302A, the etched material layer 304A over the fin region 302A, and a spacer (of the third spacers 902) over the etched material layer 304A. Additionally, in some embodiments, each of the plurality of fin stacks 1402 has a fin width 'WFin' equal to about the width of the third spacer 902 'S3W' which are used as a mask to pattern underlying features, as described above. Thus, in some embodiments, each of the plurality of fin stacks 1402 has a fin width WFin equal to about 6 nm. With respect to the above description, and with reference to FIG. 14, embodiments have been described where a group of one fin element 1404, a group of two fin elements 1406, and a group of three fin elements 1408 may be formed and used for subsequent FinFET formation having one, two, or three fin elements, respectively. In some embodiments, a group of four fin elements may also be formed, as described below with reference to FIGS. 15-18.

It should be noted that each fin region 302A of each of the plurality of fin stacks 1402, like the substrate 302, may comprise silicon or another elementary semiconductor such as germanium (Ge), silicon carbide (SiC), silicon germanium (SiGe), or diamond. Alternatively, the fin region 302A may include a compound semiconductor and/or an alloy semiconductor. By way of example, in some embodiments, the fin region 302A may also include silicon phosphide (SiP), silicon phosphorus carbide (SiPC), a silicon-on-insulator (SOI) structure, a SiGe-on-SOI structure, a Ge-on-SOI structure, a III-VI material, or a combination of any of the above materials. Further, the fin region 302A may optionally include an epitaxial layer (epi-layer), may be strained for performance enhancement, and/or have other suitable enhancement features.

The device 300 may undergo further processing to form various features and regions known in the art. For example, subsequent processing may form shallow trench isolation (STI) features, may include one or more ion implantation processes (e.g., into the fin region 302A), may include formation of one or more epitaxially-grown layers (e.g., which may include doped layers), and may include formation of high-K/metal gate stacks. In addition, subsequent processing may include formation of sidewall spacers (e.g., on the high-K/metal gate stacks), source/drain features (e.g., epitaxially grown source/drain features), etch stop layer(s), interlayer dielectric (ILD) layer(s), contact openings, contact metal, as well as various contacts/vias/lines and multilayers interconnect features (e.g., metal layers and interlayer dielectrics) on the substrate 302, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200.

Referring now to FIGS. 15-18, embodiments which include formation of a group of four fin elements are described. With reference FIG. 15, in an embodiment of blocks 214 and 218, the first spacers 602 (FIG. 8) have been selectively removed (e.g., by a wet or dry etching process) as described above, leaving the second spacers 802, 802A, 802B behind. In some examples, block 216 may be omitted such that the second spacers 802, 802A, 802B are not cut. In an embodiment of block 218, third spacers 902 may be formed on the sidewalls of second spacers 802, 802A, 802B, as described above. Referring FIG. 16, in an embodiment of block 220, the second spacers 802, 802A, 802B (FIG. 15) are selectively removed (e.g., by a wet or dry etching process), leaving the third spacers 902 behind, as previously described. In various embodiments, after removal of the second spacers 802, 802A, 802B, the third spacers 902 may be used to define fin elements (e.g., for a FinFET) within the material layer 304.

Referring to FIGS. 16/17, in an embodiment of block 222, portions of the third spacer 1602 may be selectively removed leaving behind other portions of the third spacer 902. As previously discussed, the portion of the third spacer (e.g., portion 1602) which is selected to be cut, may be defined by a lithography process, for example, including resist deposition, exposure, and development, where areas to be cut are free from the patterned resist, while areas not to be cut may be protected by the patterned resist. In some examples, cutting the portion of the third spacer prevents corresponding features (e.g., fin features) from being formed in the material layer 304. In various examples, other portions of the third spacer may alternatively be selected to be cut, depending on a desired feature(s) to be patterned into the material layer 304.

Figure 17:
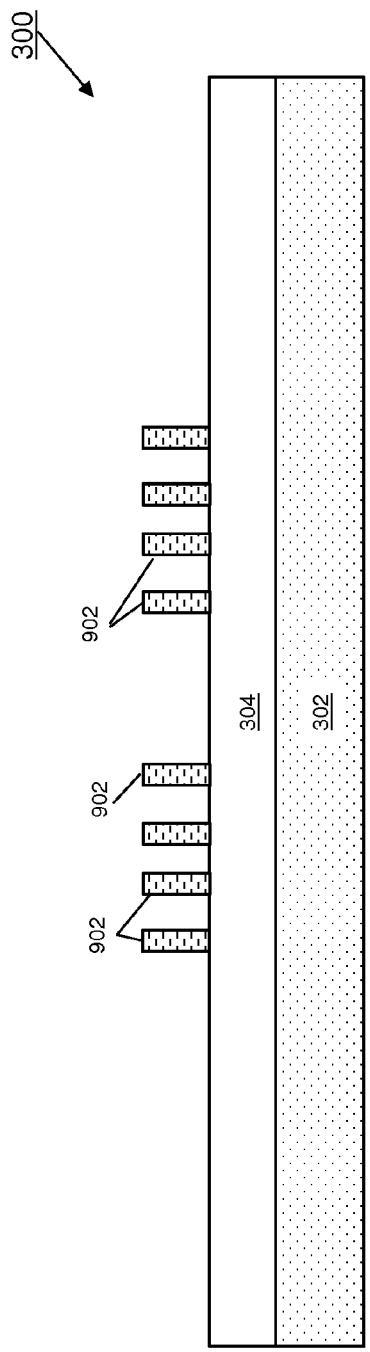
Figure 18:
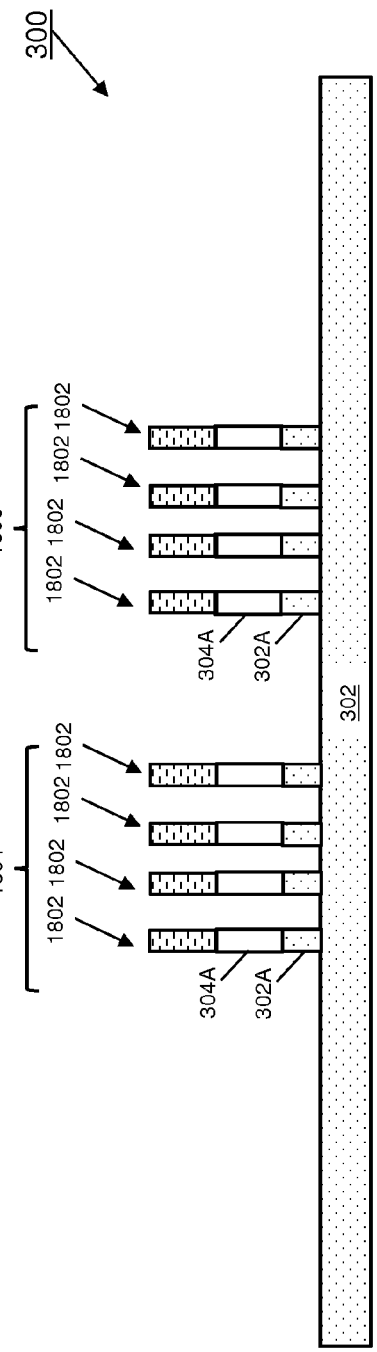

Referring to the example of FIGS. 17/18, in an embodiment of block 224, the material layer 304 is etched (e.g., by a wet or dry etch). As shown, the remaining third spacers 902 serve as an etch mask and the pattern defined by the spacers 902 is transferred to the underlying etched material layer 304A. Thereafter, the substrate 302 is etched (e.g., by a wet or dry etch) to form a plurality of fin regions 302A, where the third spacers 902 serve as an etch mask and the pattern defined by the third spacers 902 is transferred to the substrate 302. In some examples, each of the fin regions 302A defines a channel region of a FinFET device. Thus, as shown in FIG. 18, a plurality of fin stacks 1802 is formed, where each of the plurality of fin stacks 1802 includes the fin region 302A, the etched material layer 304A over the fin region 302A, and a spacer (of the third spacers 902) over the etched material layer 304A. Additionally, in some embodiments, each of the plurality of fin stacks 1802 has a fin width 'WFin' equal to about the width of the third spacer 902 'S3W' which are used as a mask to pattern underlying features, as described above. Thus, in some embodiments, each of the plurality of fin stacks 1802 has a fin width WFin equal to about 6 nm. With respect to the above description, and with reference to FIG. 18, embodiments have been described where a group of four fin elements 1804, 1806 may be formed and used for subsequent FinFET formation having four fin elements. It will be understood that the device 300 having any combination of fin stacks including one, two, three, or four elements, as described above with reference to FIGS. 2-18, may be fabricated simultaneously, on the same substrate 302, without departing from the scope of the present disclosure. In various embodiments, formation of fin stacks including one, two, three, or four elements, as described above, is determined at least in part by the mandrel widths MW1, MW2, MW3, the width of the first spacer S1W, the width of the second spacer S2W, the width of the third spacer S3W, performing the optional second spacer cut, and performing the optional third spacer cut.

Figure 19:
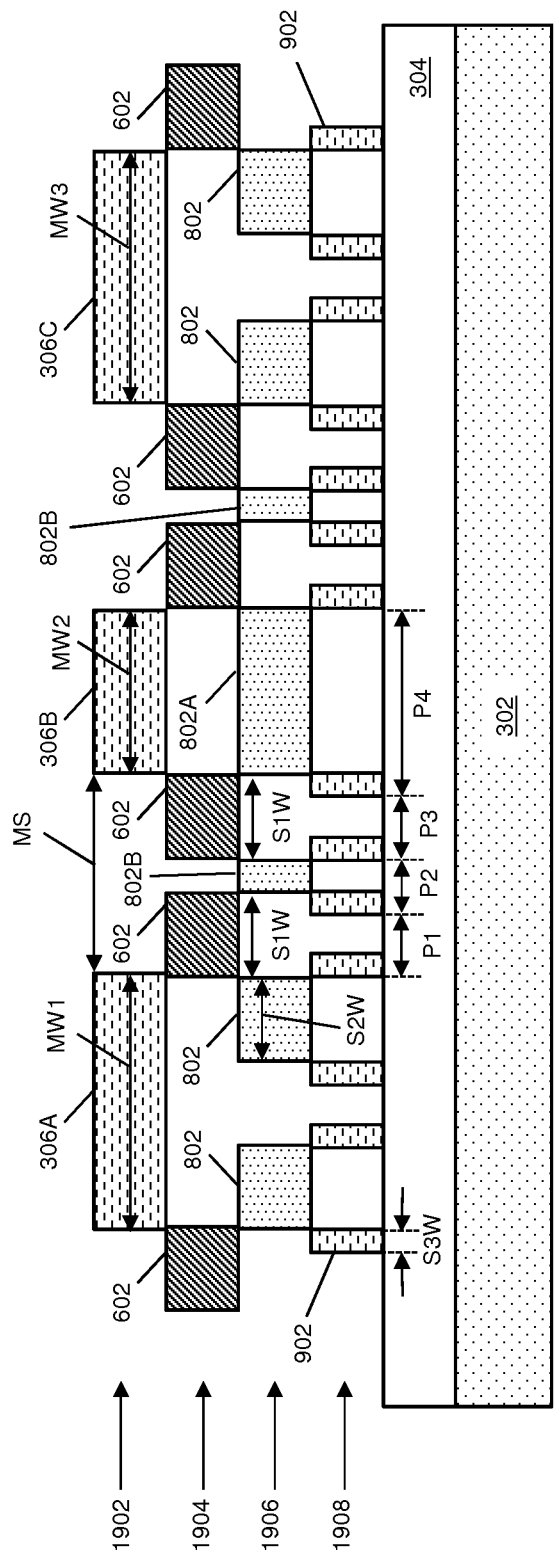
FIG. 19 illustrates a schematic cross-sectional representation including mandrels and spacers used to form fin elements within a substrate, in accordance with some embodiments.

FIG. 19 illustrates a schematic cross-sectional representation of the mandrel and all spacers used to form fin elements within the substrate, in accordance with some embodiments. It is noted that while the mandrel and all spacers (i.e., first, second, and third spacers) may not all be simultaneously present during processing (or be disposed as shown in FIG. 19), as described above, the illustration of FIG. 19 is provided merely to describe the width, spacing, and/or pitch relationship among the mandrel and various spacer layers with greater clarity. As shown in FIG. 19, layer 1902 includes mandrels 306A, 306B, 306C, formed at block 206, layer 1904 includes the first spacers 602 formed at block 208, layer 1906 includes the second spacers 802, 802A, 802B, formed at block 212, and layer 1908 includes the third spacers 902 formed at block 218. As described above, in some embodiments, the mandrels 306A, 306B, 306C have a width MW1, MW2, and MW3, respectively; the first spacers 602 have a width S1W; the second spacers 802 have a nominal target width S2W; and the third spacers 902 have a width S3W. As shown in FIG. 19, various pitch values may be defined. For example, a first pitch 'P1' is defined as S1W-S3W. In some embodiments, P1 may be equal to about 20 nm. As described above, a mandrel spacing 'MS' between adjacent mandrels may also be defined. Thus, in some examples, a second pitch 'P2' is defined as (MS−2*S1W)+S3W. In some embodiments, P2 may be in a range from about 20-26 nm. In some embodiments, a third pitch 'P3' is defined as S1W-S3W. In some examples, P3 may be equal to about 20 nm. In some cases, a fourth pitch 'P4' is defined as MW2+S3W. While some specific pitch examples have been defined, it will be understood that various other pitches and spacings may be defined in accordance with the width and spacing of each of the mandrels and first, second, and third spacers. Broadly, in various embodiments, the spacings, widths, and pitches may be appropriately selected as needed to define any number of a plurality of fin elements (e.g., one, two, three, four, etc.) having various configurations. By providing a triple spacer configuration, more spacing/pitch combinations may be made available while also increasing the CD/overlay budget. Additionally, by performing one or both of the second and third spacer cut processes (e.g., blocks 216 and 222), the process margin may be further increased. Thus, embodiments as disclosed herein provide for increased layout flexibility, while also increasing the CD/overlay budget and improving overall process margin.

With respect to the description provided herein, the present disclosure offers methods for utilizing a hybrid lithographic patterning process which may include one or more of a triple spacer process, a spacer merge process, and a spacer cut process in the formation of FinFET devices to mitigate at least some of the problems associated with lithographic patterning of highly-scaled structures and devices. For example, current lithography techniques may be limited, for instance, in their alignment precision and repeatability of the equipment used (e.g., a photolithography stepper), as well as in the minimum feature size that may be printed. Thus, current lithography tools may not provide sufficient process margin, in particular when employing existing photolithography processes. As a result, FinFET critical dimensions (CDs) may be directly impacted by pattern misalignment, or other lithography errors, which can result in degraded device performance and/or device failure. By providing the disclosed triple spacer process, including methods for cutting the second and/or third spacers, as well as methods for merging one or both of the first and second spacers, embodiments of the present disclosure advantageously provide methods for increased layout flexibility, while also increasing the CD/overlay budget and improving overall process margin. Those of skill in the art will readily appreciate that the methods and structures described herein may be applied to a variety of other semiconductor devices to advantageously achieve similar benefits from such other devices without departing from the scope of the present disclosure.

Thus, one of the embodiments of the present disclosure described a method for fabricating a semiconductor device, for example, such as a FinFET device. In some embodiments, the method includes forming a plurality of first spacers over a substrate. Each first spacer of the plurality of first spacers has a first spacer width. In some examples, a second spacer of a plurality of second spacers is deposited on sidewalls of each first spacer of the plurality of first spacers. Each second spacer of the plurality of second spacers has a second spacer width. In some embodiments, a third spacer of a plurality of third spacers is formed on sidewalls of each second spacer of the plurality of second spacers. Each third spacer of the plurality of third spacers has a third spacer width. In various embodiments, a first etch process is performed on the substrate to form fin regions within the substrate. By way of example, the plurality of third spacers mask portions of the substrate during the first etch process, and a fin region width is substantially equal to about the third spacer width.

In another of the embodiments, discussed is a method where a plurality of mandrels are formed over a substrate, and a pair of first spacers each having a first spacer width are formed on sidewalls of each mandrel of the plurality of mandrels. Thereafter, the plurality of mandrels are etched, and a pair of second spacers each having a second spacer width are formed on sidewalls of each first spacer. In some embodiments, the first spacers are removed, and a pair of third spacers each having a third spacer width are formed on sidewalls of each second spacer. In various examples, the second spacers are etched, and a first etch process is performed to form fin regions within the substrate, where the third spacers mask portions of the substrate during the first etch process. By way of example, a fin region width is substantially equal to about the third spacer width.

In yet another of the embodiments, discussed is a method of fabricating a semiconductor device including fabricating mandrels over a substrate, where the mandrels define a pattern for subsequently formed first spacers. In some embodiments, the first spacers are formed on sidewalls of the mandrels, where the first spacers define a pattern for subsequently formed second spacers. In various examples, the mandrels are removed, and second spacers are formed on sidewalls of the first spacers. Thereafter, the first spacers are etched, and a second spacer cut process is performed to remove a first set of second spacers and leave a second set of second spacers. In some embodiments, third spacers are formed on sidewalls of the second set of second spacers. The second set of second spacers is etched, and a third spacer cut process is performed to remove a first set of third spacers and leave a second set of third spacers. In some examples, a substrate etch process is performed to form fin regions within the substrate, where the second set of third spacers mask portions of the substrate during the substrate etch process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device fabrication, comprising:
    forming a plurality of first spacers over a substrate, wherein each first spacer of the plurality of first spacers has a first spacer width;
    depositing a second spacer of a plurality of second spacers on sidewalls of each first spacer of the plurality of first spacers, wherein each second spacer of the plurality of second spacers has a second spacer width;
    forming a third spacer of a plurality of third spacers on each opposing sidewall of each second spacer of the plurality of second spacers, wherein each third spacer of the plurality of third spacers has a third spacer width; and
    performing a first etch process on the substrate to form fin regions within the substrate, wherein the plurality of third spacers mask portions of the substrate during the first etch process, and wherein a fin region width is substantially equal to about the third spacer width.

2. The method of claim 1, further comprising:
    prior to forming the third spacer, performing a second etch process to selectively remove the plurality of first spacers without substantial etching of surrounding materials.

3. The method of claim 2, further comprising:
    prior to performing the first etch process, performing a third etch process to selectively remove the plurality of second spacers without substantial etching of surrounding materials.

4. The method of claim 3, further comprising:
    after performing a third etch process and prior to performing the first etch process, performing a third spacer cut process to selectively remove at least one third spacer of the plurality of third spacers.

5. The method of claim 2, further comprising:
    after performing a second etch process and prior to forming the third spacer, performing a second spacer cut process to selectively remove at least one second spacer of the plurality of second spacers.

6. The method of claim 1, wherein a spacing between adjacent first spacers is configured such that second spacers formed on sidewalls of the adjacent first spacers physically merge to form a merged second spacer.

7. The method of claim 6, wherein a width of the merged second spacer has a value between about the second spacer width and twice the second spacer width.

8. The method of claim 1, wherein performing the first etch process further includes performing the first etch process to form a fin region including at least one of a group of one fin element, two fin elements, three fin elements, and four fin elements.

9. The method of claim 1, wherein a pitch between adjacent fin regions is equal to about one of the first spacer width minus the third spacer width, (a mandrel spacing minus twice the first spacer width) plus the third spacer width, and a mandrel width plus the third spacer width.

10. A method of semiconductor device fabrication, comprising:
    forming a plurality of mandrels over a substrate and forming a pair of first spacers each having a first spacer width on sidewalls of each mandrel of the plurality of mandrels;
    etching the plurality of mandrels and forming a pair of second spacers each having a second spacer width on sidewalls of each first spacer;
    removing the first spacers and forming a pair of third spacers each having a third spacer width on sidewalls of each second spacer; and
    after forming the pair of third spacers, etching the second spacers and performing a first etch process to form fin regions within the substrate, wherein the third spacers mask portions of the substrate during the first etch process, and wherein a fin region width is substantially equal to about the third spacer width.

11. The method of claim 10, wherein the plurality of mandrels are configured to have a first etch selectively and the first spacers are configured to have a second etch selectivity, and wherein etching the plurality of mandrels selectively removes the plurality of mandrels without substantial etching of the first spacers.

12. The method of claim 10, wherein the first spacers are configured to have a first etch selectivity and the second spacers are configured to have a second etch selectively, and wherein removing the first spacers includes selectively etching the first spacers without substantial etching of the second spacers.

13. The method of claim 10, wherein the second spacers are configured to have a first etch selectivity and the third spacers are configured to have a second etch selectively, and wherein etching the second spacers selectively removes the second spacers without substantial etching of the third spacers.

14. The method of claim 10, wherein each mandrel of the plurality of mandrels has a mandrel width and adjacent mandrels of the plurality of mandrels are separated by a distance equal to a mandrel spacing, and wherein the mandrel width and mandrel spacing serve to define at least one of a width, pitch, and spacing of subsequently formed spacers.

15. The method of claim 10, wherein a spacing between adjacent first spacers is configured such that second spacers formed on sidewalls of the adjacent first spacers physically merge to form a merged second spacer.

16. The method of claim 10, wherein a spacing between adjacent mandrels of the plurality of mandrels is configured such that first spacers formed on sidewalls of the adjacent mandrels physically merge to form a merged first spacer.

17. The method of claim 10, further comprising:
    after removing the first spacers and prior to forming the pair of third spacers, performing a second spacer cut process to selectively remove at least one second spacer.

18. The method of claim 10, further comprising:
after etching the second spacers and prior to performing the first etch process, performing a third spacer cut process to selectively remove at least one third spacer.

19. A method of fabricating a semiconductor device, comprising:
fabricating mandrels over a substrate, wherein the mandrels define a pattern for subsequently formed first spacers;
forming the first spacers on sidewalls of the mandrels, wherein the first spacers define a pattern for subsequently formed second spacers;
removing the mandrels and forming second spacers on sidewalls of the first spacers;
etching the first spacers and performing a second spacer cut process to remove a first set of second spacers and leave a second set of second spacers;
forming third spacers on sidewalls of the second set of second spacers;
etching the second set of second spacers and performing a third spacer cut process to remove a first set of third spacers and leave a second set of third spacers; and
performing a substrate etch process to form fin regions within the substrate, wherein the second set of third spacers mask portions of the substrate during the substrate etch process.

20. The method of claim 19, wherein performing the substrate etch process includes performing the substrate etch process to form a plurality of fin regions in the substrate, wherein each fin region includes at least one of a group of one fin element, two fin elements, three fin elements, and four fin elements.

* * * * *